(12) United States Patent
Ramappa et al.

(10) Patent No.: US 8,592,230 B2
(45) Date of Patent: Nov. 26, 2013

(54) METHOD FOR PATTERNING A SUBSTRATE USING ION ASSISTED SELECTIVE DEPOSTION

(75) Inventors: Deepak A. Ramappa, Cambridge, MA (US); Ludovic Godet, Boston, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 237 days.

(21) Appl. No.: 13/091,289

(22) Filed: Apr. 21, 2011

(65) Prior Publication Data

US 2011/0259408 A1 Oct. 27, 2011

Related U.S. Application Data

(60) Provisional application No. 61/326,788, filed on Apr. 22, 2010.

(51) Int. Cl.
*H01L 21/00* (2006.01)
(52) U.S. Cl.
USPC .................. 438/22; 136/255; 257/E31.048
(58) Field of Classification Search
USPC .................. 438/22; 136/255; 257/E31.048
See application file for complete search history.

(56) References Cited

U.S. PATENT DOCUMENTS

| | | | |
|---|---|---|---|
| 7,524,743 B2 | 4/2009 | Gupta et al. | |
| 7,767,977 B1 | 8/2010 | Godet et al. | |
| 2007/0065594 A1 | 3/2007 | Chiang et al. | |
| 2008/0000521 A1 | 1/2008 | Sivoththaman et al. | |
| 2008/0049888 A1 | 2/2008 | Leung et al. | |
| 2010/0012188 A1 | 1/2010 | Garnett | |
| 2010/0252531 A1 | 10/2010 | Godet et al. | |
| 2010/0255683 A1 | 10/2010 | Godet et al. | |
| 2011/0124186 A1 | 5/2011 | Renau et al. | |
| 2011/0151610 A1 | 6/2011 | Ramappa et al. | |

OTHER PUBLICATIONS

Dixon T K Kwonk, One-step non-contact patterns transferring by plasma based ion implantation, IOP Publishing J. Phys. D. Apply. Phys. 41 (2008) 225501, pp. 1-5.*

* cited by examiner

*Primary Examiner* — Shaun Campbell

(57) ABSTRACT

A method of patterning a substrate includes providing a focusing plate adjacent to a plasma chamber containing a plasma, the focusing plate configured to extract ions from the plasma through at least one aperture that provides focused ions towards the substrate. The method further includes directing first ions through the at least one aperture to one or more first regions of the substrate so as to condense first gaseous species provided in ambient of the substrate on the one or more first regions of the substrate.

17 Claims, 7 Drawing Sheets

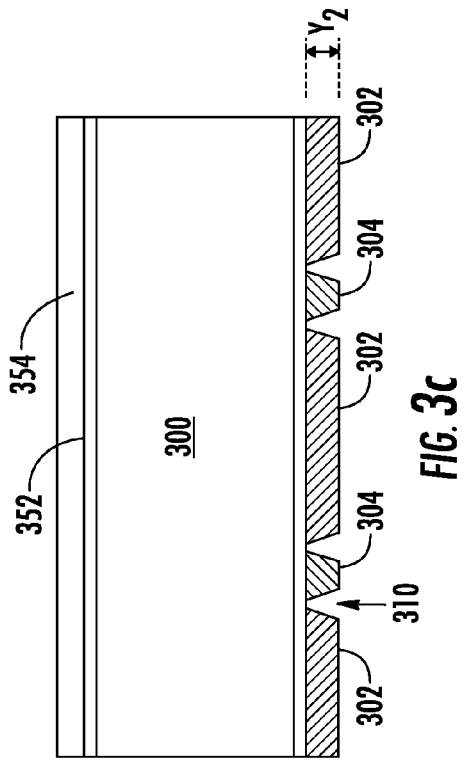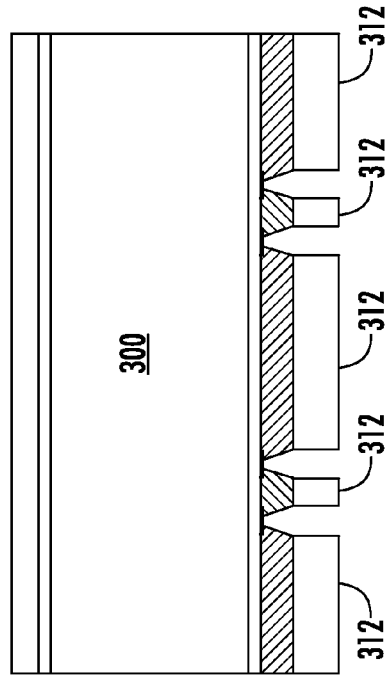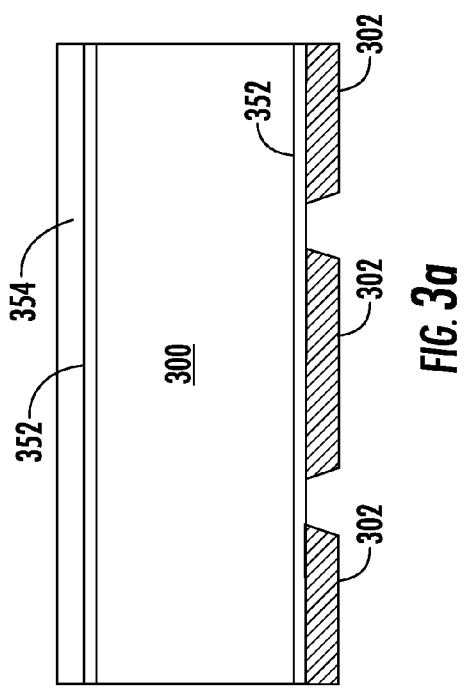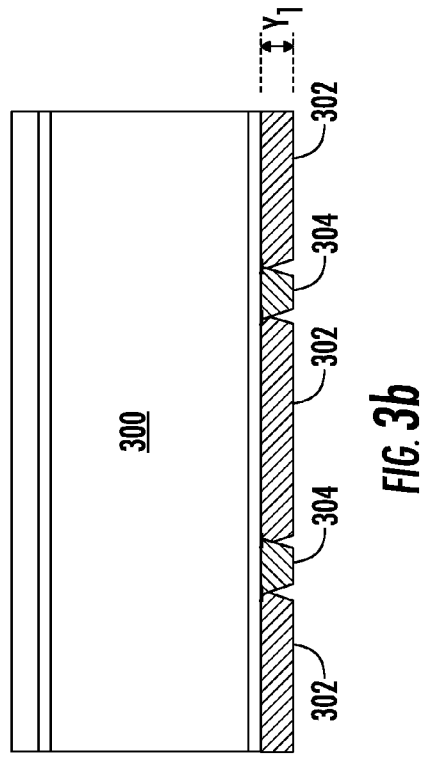
FIG. 3a
FIG. 3b
FIG. 3c
FIG. 3d

METHOD FOR PATTERNING A SUBSTRATE USING ION ASSISTED SELECTIVE DEPOSTION

This application claims priority to U.S. provisional patent application Ser. No. 61/326,788, filed Apr. 22, 2010, and incorporated by reference herein in its entirety.

BACKGROUND OF THE INVENTION

1. Field of the Invention

Embodiments of the invention relate to the field of device manufacturing. More particularly, the present invention relates to a method, system and structure for maskless formation of patterned areas on a substrate.

2. Discussion of Related Art

Modern devices, such as semiconductor chips, microelectromechanical (MEMS), magnetic storage devices, and solar cells are typically fabricated using complex patterning processes such as photolithography. In the field of solar cells, an interdigitated back contact (IBC) solar cell shows promise due to the high efficiency that is rendered possible by placement of electrodes on the back surface of the device so that no light for producing electric current is blocked. Commercial examples of such cells include heterojunction IBC cells offered by Sanyo corporation and homojunction IBC cells offered by SunPower Corporation. Although IBC cells may provide high efficiency, the number of manufacturing steps and costs associated with each step contribute to comparatively higher costs to manufacture. In addition, these steps also contribute to a low throughput, meaning the overall amount of IBC cells that can be manufactured in a given time period. Some of the factors that contribute to the higher costs and lower throughput include: a) two lithographic patterning steps, which add considerable expense due to the inherent complexity of photolithographic tools and related processes; b) costs of consumables used in conjunction with lithography (photoresist, developers, hardmasks, etch, strip, etc.); and c) metallization processes, including plating materials and tooling.

FIG. 1 illustrates one prior art conventional method for forming a heterojunction IBC cell. This conventional method requires the formation of alternate, patterned stacked dielectric layers consisting of intrinsic amorphous silicon (a-Si) and doped amorphous silicon. An interdigitated layout having alternate p-type and n-type doped structures may be formed by the process illustrated. Other layouts may have more complex p-type and n-type structures. At step 90, an n-type substrate is selected and texturing of the substrate takes place using KOH at step 92. At step 94, chemical oxide is grown on the substrate. At step 96, intrinsic amorphous silicon is grown on both sides of a wafer. At step 98, a nitride antireflective coating is grown. At step 102, P-doped amorphous silicon is grown on the back side. At step 104, a lithography coating process takes place to pattern the p-doped layer. At step 106, a plasma etch takes place to etch out regions of the P-doped layer. At step 108, resist is removed. At step 110, a thin layer of intrinsic amorphous silicon is deposited, followed by a thicker layer of N+ doped amorphous silicon on the back side. The N+ doped amorphous silicon may fill in the etched out regions as well as overcoat the patterned P-doped regions. At step 112, a blanket plasma etch is performed, which may etch away the N+ overcoat. At step 114 a lithographic patterning process takes place to define the final pattern of N+ and P+ regions. At step 116, a plasma etch of the backside takes place to pattern and isolate N+ and P+ regions from one another. At step 118, resist is removed. At step 120, the patterned substrate is rinsed, dried, and subjected to an HF clean. At step 122 metal contacts are added to the P+ and N+ regions by screen printing.

As illustrated above, the formation of these types of structures requires at least two lithography steps and an associated set of etch and deposition steps. Because of these steps, the overall throughput and cost of IBC solar cells may be less than ideal for widespread commercial deployment. In view of the above, it will be appreciated that there is a need to improve processing techniques for devices requiring formation of patterned regions that are produced using complex patterning techniques.

SUMMARY OF THE INVENTION

Embodiments of the present invention are directed to methods and systems for improving patterning a substrate, in particular, for selectively depositing material on a substrate. In one embodiment, a method of patterning a substrate includes providing a focusing plate adjacent to a plasma chamber containing a plasma. The focusing plate is configured to extract ions from the plasma through at least one aperture that provides focused ions towards the substrate, and direct first ions through the at least one aperture to one or more first regions of the substrate to condense first gaseous species provided in ambient of the substrate on the one or more first regions of the substrate.

In another embodiment, a heterojunction interdigitated back contact solar cell includes a base portion of the solar cell having a back contact surface. The solar cell includes a plurality of first portions that comprise a semiconductor material of a first dopant type where each first portion comprises a faceted cross-section. The solar cell also includes a plurality of second portions that comprise a semiconductor material of a second dopant type where each second portion comprising a faceted cross-section. The first and second portions form an interdigitated structure in which each first portion is isolated from an adjacent second portion.

BRIEF DESCRIPTION OF THE DRAWINGS

FIG. 3a-3d is cross sectional view of a heterojunction IBC cell manufactured in accordance with an embodiment of the disclosure;

DESCRIPTION OF EMBODIMENTS

Figure 1:
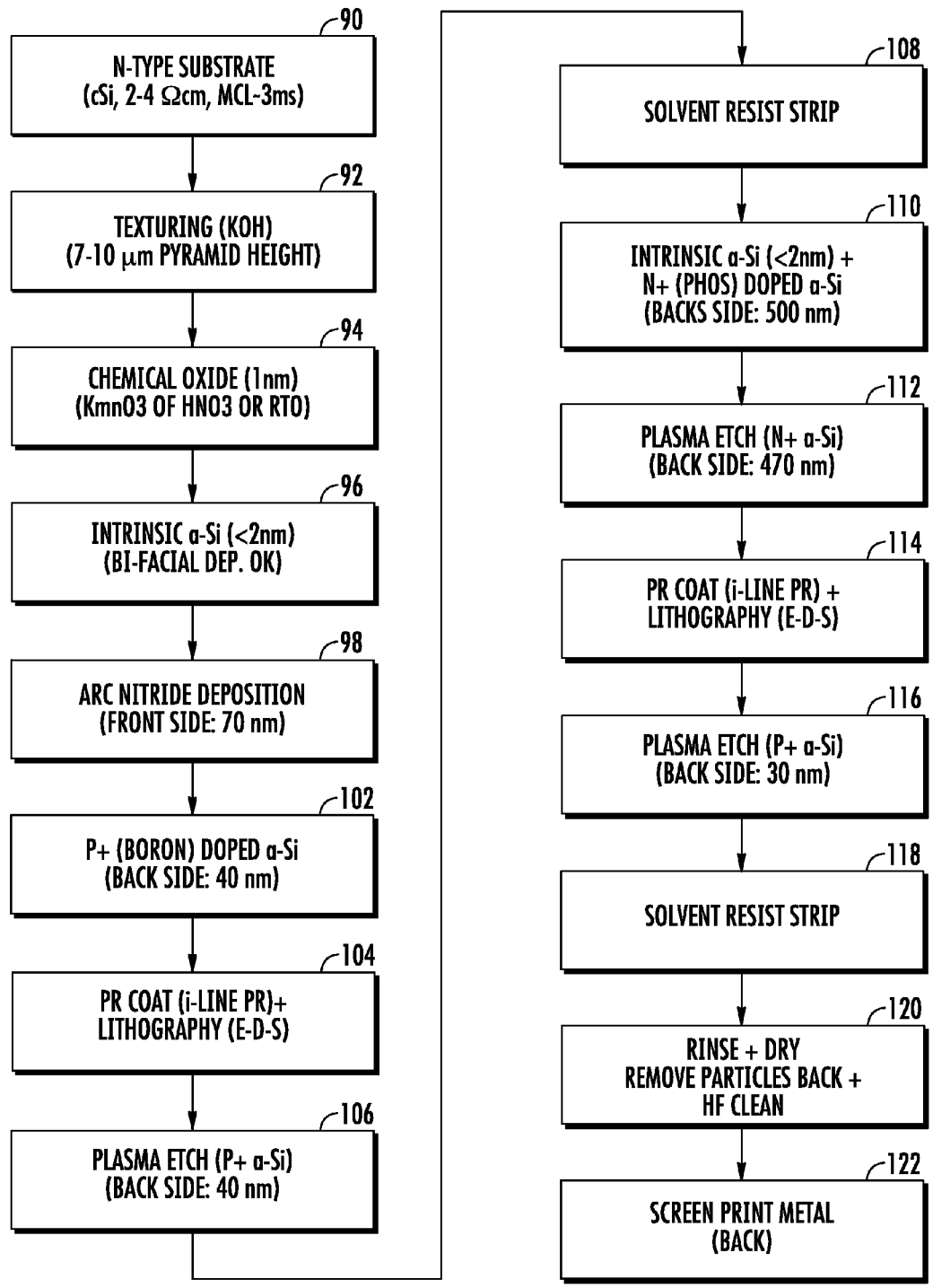
FIG. 1 is flow chart of a prior art method to manufacture a heterojunction IBC solar cell.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, novel and inventive techniques and systems for patterning a substrate are introduced. In various embodiments, an ion-assisted selective deposition technique is employed to fabricate patterned structures in a substrate. In some embodiments, the ion-assisted selective deposition is used to provide patterned doping of a substrate. In other embodiment, ion-assisted selective deposition may be used to selectively place on a substrate a coating or portions of a coating, such as an insulator or metallic layer. Among other benefits that accrue to this technique are the ability to fabricate structures and devices while eliminating at least some of the complex lithographic processing conventionally employed to pattern a substrate. In addition to lithographic patterning steps, the etching, cleaning, and related processes can be avoided which may substantially impact manufacturing complexity, throughput, and cost. In embodiments for fabricating solar cells, as detailed below, selective doping of p-type and n-type regions may be performed without the use of lithographic resist processes or other mask processes.

Figure 2:
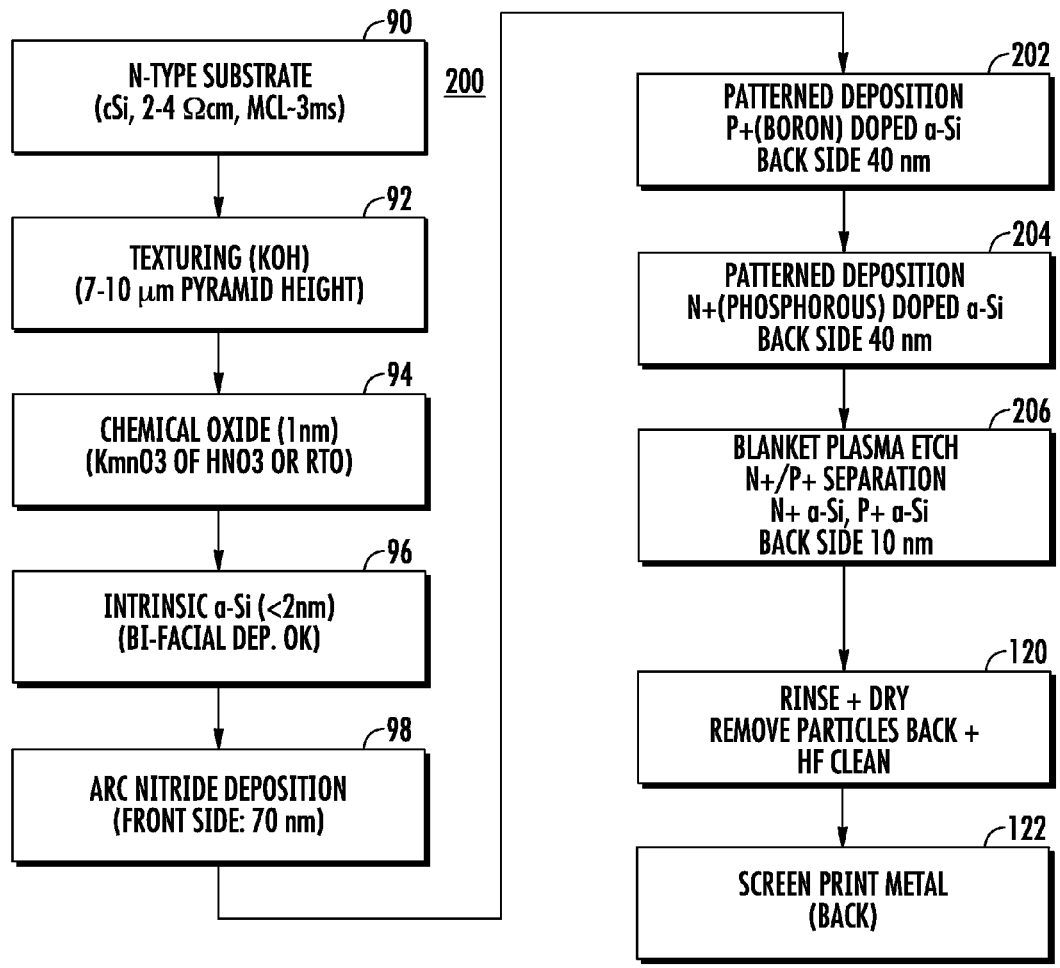
FIG. 2 is a flow chart of a method consistent with an embodiment of the disclosure.

FIG. 2 is a flow chart that depicts a method 200 consistent with an embodiment of the disclosure for manufacturing a heterojunction IBC solar cell. As is well known, high efficiency heterojunction solar cells may be formed using amorphous silicon (a-Si)/crystalline silicon (c-Si) structure due in part to high open circuit voltages that can be obtained. In the embodiment of FIG. 2, the method 200 may be used to fabricate such an a-Si/c-Si heterojunction interdigitated back contact (IBC) solar cell. The blocks 90-98 are as in the conventional method depicted in FIG. 1. After block 98, in which an antireflective coating (ARC) is deposited on the substrate frontside, a patterned p-doped (such as boron) a-Si deposition layer may be deposited on the back side of the cell in block 202. The deposition layer may be, for example, 40 nm thick in some embodiments. A patterned n-doped (such as phosphorous) a-Si deposition layer may then be deposited on the back side of the cell to create alternating p-type and n-type regions on the back side of the cell. This deposition layer may also be about, for example, 40 nm thick. Other thicknesses are also contemplated. A blanket plasma etch may then be performed to separate the p-type and n-type regions, as illustrated at block 206. A rinse and dry operation 120 followed by a screen print/plating operation 122 may then be performed.

As compared to the conventional process for forming an IBC solar cell (see FIG. 1), the method 200 eliminates the nine steps 102-118 that are associated with forming N+ and P+ regions for back side contacts. These eliminated steps include silicon deposition, lithographic patterning, and etching steps, which are replaced in the present embodiment by a maskless patterned deposition block for forming P+ (202) and N+ (204) regions on the back side of a substrate, as well as a blanket etch process. Accordingly, the method 200 may facilitate formation of a heterojunction IBC in a much simpler and less costly manner as compared to conventional processes. In particular, in addition to eliminating steps to deposit and pattern photoresist, expensive etching processes such as reactive ion etching (plasma etch) are eliminated.

FIGS. 3a-d illustrate various processing stages of a substrate subjected to selected processes to create a heterojunction IBC solar cell 300 consistent with the embodiments of the disclosure and generally described at blocks 202, 204, 206, and 122 of FIG. 2. In particular, FIG. 3a illustrates a step in which a p-doped a-Si portion 302 is selectively deposited on portions of the back side of IBC solar cell 300. As depicted, IBC solar cell 300 may have an intrinsic amorphous silicon (a-Si) layer 352 which may be a conventional layer deposited for the purposes of increasing open circuit voltage as will be readily appreciated by those of ordinary skill in the art. IBC also includes an ARC layer 354 on the front side.

In various embodiments, the deposition of p-doped a-Si portions 302 may be carried out using an ion-assisted selective deposition process that directs ions to target areas of the backside of IBC solar cell 300. The ions may be used to enhance deposition of p-doped a-Si portions 302 in those regions of the IBC cell that are exposed to the ions, as described further in the discussion to follow. In some embodiments, the ion-assisted selective deposition may be performed using a plasma processing apparatus and method as discussed below with respect to FIGS. 5 and 6, and further described in an earlier patent application Ser. No. 12/645,638 filed Dec. 23, 2009 (entitled "ENHANCED ETCH AND DEPOSITION PROFILE CONTROL USING PLASMA SHEATH ENGINEERING") assigned to the assignee of the present invention, which is incorporated herein by reference in its entirety.

Once p-doped a-Si portions 302 are deposited on target regions of the back side of IBC solar cell 300, patterned n-doped a-Si portions 304 may be deposited on other target regions of the back side of the IBC solar cell 300. As illustrated in FIG. 3b, the target regions for formation of the n-doped a-Si portions 304 may lie in between the earlier deposited p-doped a-Si portions 302. As with the formation of the p-doped portions, formation of the n-doped a-Si portions 304 may be accomplished using an ion-assisted selective deposition process. Although formation of n-doped a-Si portions 304 is illustrated as being formed after p-doped a-Si portions 302, the order of these may be reversed in other embodiments.

As shown in FIG. 3c, a blanket etch may then be performed on the back side of the IBC solar cell 300 to create or to enhance the separation between the a-Si portions 302, 304. In one example, 10 nm of thickness may be removed from the a-Si portions 302, 304, such that the height ($Y_2$) of the a-Si portions 302, 304 is slightly less than their previous height ($Y_1$) before the blanket etch. However, this amount may vary in embodiments; for example, the amount etched may increase with increasing thickness of the deposited a-Si portions 302, 304. For example, nm may be removed for initial deposit thickness of 40 nm, while 25 nm is removed for initial deposit thickness of 100 nm. The etch may thereby ensure that a gap 310 is formed between the a-Si portions 302, 304 to create electrical separation between the same, if desired. The blanket etch may be performed in an etch tool separate from a tool that deposits the a-Si portions 302, 304. Alternatively, the etch process may be performed in-situ in the same tool, such as a plasma processing tool, that is used to deposit the a-Si portions 302, 304. In various embodiments the etch may be a blanket chemical etch or a sputtering etch. However, it may be desirable to carefully control the etching of the a-Si portions 302, 304 in order to control etching of the desired amorphous silicon areas without sputtering the underlying intrinsic a-Si layer 352. Finally, as illustrated in FIG. 3D, plating/screen printing using known processes may be performed to provide metallic contacts 312 to the back side of the IBC solar cell 300.

Figure 4C:
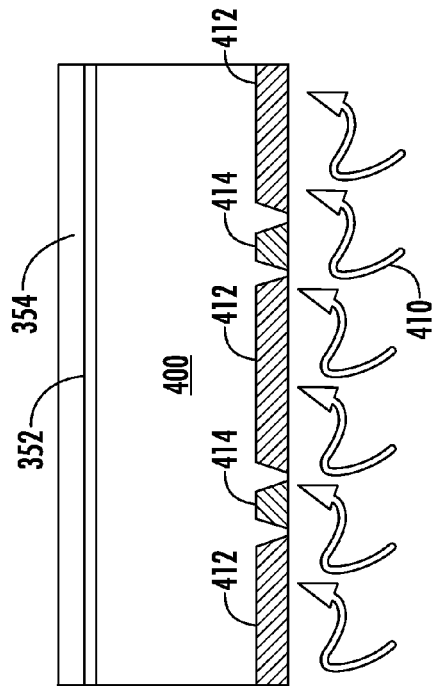
FIG. 4a-4d is cross sectional view of a homojunction IBC cell manufactured in accordance with an embodiment of the disclosure.
Figure 4D:
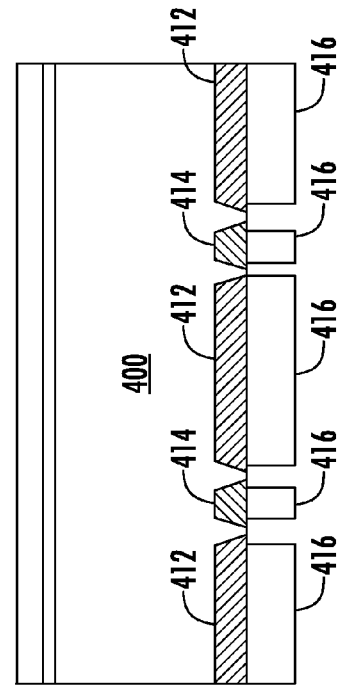
Figure 4A:
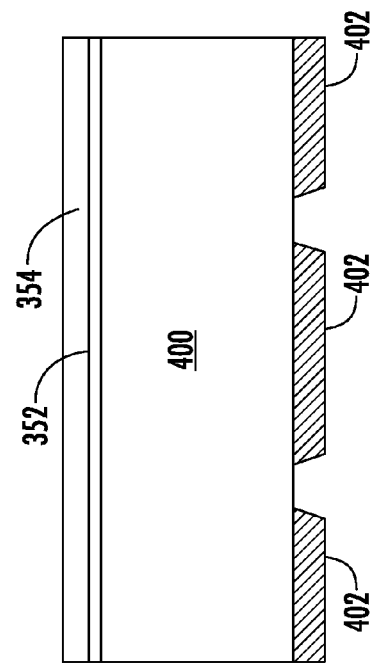
Figure 4B:
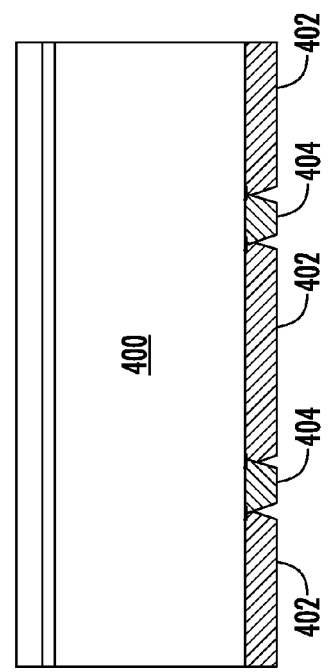

Instead of a-Si material, in other embodiments, ion-assisted selective deposition may be used to selectively deposit other material, such as insulators, electrically conductive material, and semiconductor dopant material. In one embodiment, doped regions for back side contact of a homojunction IBC solar cell may be formed using ion-assisted selective deposition. In the case of a homojunction IBC cell, no a-Si layer may be present on the backside of the cell so that dopant for the backside contacts may be introduced into the crystalline substrate itself. In some embodiments, thin portions of a solid source of a p-type dopant (e.g., boron) and n-type dopant (e.g., phosphorous) may be deposited on the substrate in the respective desired areas. FIG. 4a illustrates selective deposition of p-type dopant material (e.g., boron) portions 402 on the back side of a homojunction IBC cell 400 forming a pattern of material regions separated by gaps. FIG. 4b illustrates selective deposition of n-type dopant material (e.g. phosphorous) portions 404, which may be deposited between the p-type dopant material portions 402. As illustrated in FIG. 4c, the dopant material portions 402, 404 may then be diffused into the back side of the IBC cell using radiation 410, forming p-type contact regions 412 and n-type contact regions 414. These regions may be formed using radiation such as laser radiation that performs a laser melt anneal, or may be formed from radiation from a conventional rapid thermal annealing source, or may be from a conventional oven source. After, annealing plating of contacts 416 may be performed, as illustrated in FIG. 4d. Thus, a single maskless doping step combined with an annealing step can be used to form n-type or p-type patterned doped areas.

The processes disclosed in FIGS. 2-4 may be especially useful since performing maskless deposition of dopant and annealing may result in better separation of p-type emitter and n-BSF regions of the solar cell device. For example, the growth of selectively deposited silicon material may produce a natural faceting of edge portions of deposited material during the deposition process. Thus, after deposition, adjacent top surfaces of deposited a-Si portions (see elements 302, 304) may be clearly separated from one another. In contrast, using conventional processing outlined in FIG. 1, during formation of p-type and n-type regions, one dopant type may form a blanket region that overlies isolated regions of the second dopant type and fills in substrate regions that lie in between the isolated regions. When an etch (112) to remove the overcoat layer is performed the resulting structure may comprise pillar type n- and p-type regions that abut one another. After the subsequent etch to isolate the n-type and p-type regions (116), the and isolate the p-type and n-type regions, the resulting structure may be n-type and p-type regions having relatively vertical sidewalls, which may provide less isolation that the faceted sidewalls of the n-type and p-type portions produced according to some of the present embodiments.

Figure 5:
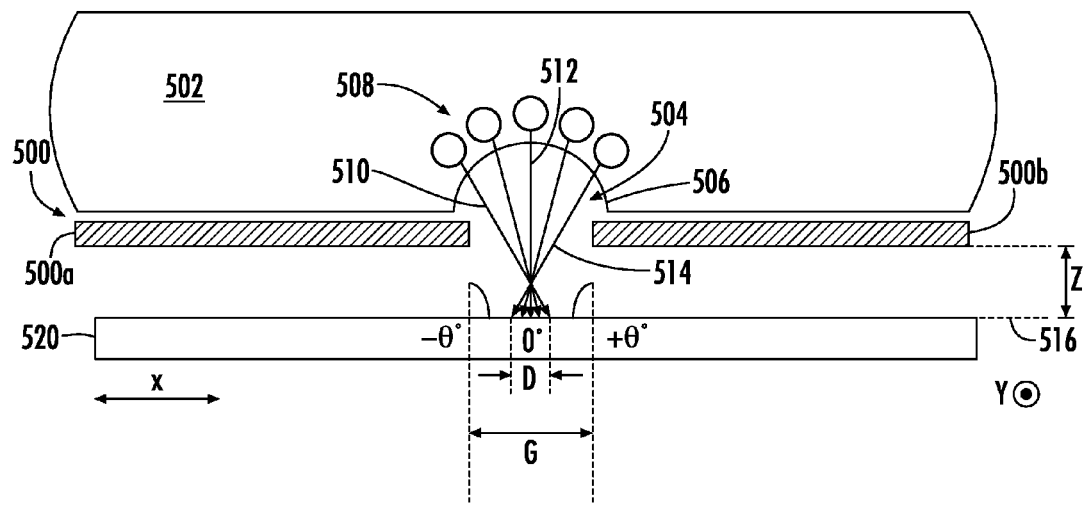
FIG. 5 depicts a focusing plate consistent with an embodiment of the disclosure.

As noted above, in various embodiments, a plasma-based system may be used to direct ions to a substrate to perform patterning, such as performing patterned doping of an IBC solar cell. FIG. 5 is a cross-sectional view of a focusing plate system within a plasma system that may be used to perform patterned ion bombardment of a substrate. The focusing plate system 500 is disposed adjacent a plasma 502 and configured to modify an electric field within the plasma sheath 504 to control a shape of a boundary 506 between plasma 502 and the plasma sheath 504. The boundary 506 between the plasma 502 and the plasma sheath 504 may have a convex shape relative to the plane 516 that lies parallel to the surface of substrate 520 in one instance. Accordingly, ions 508 that are attracted from the plasma 502 across the plasma sheath 504 may strike the substrate 520 at a large range of incident angles. The plasma 502 is generated as is known in the art in various embodiments.

In the embodiment of FIG. 5, the focusing plate system 500 includes a pair of panels 500a and 500b defining a gap there between having a horizontal spacing (G). The panels 500a,b may be an insulator, semiconductor, or conductor. In other embodiments, the focusing plate system 500 may be a single focusing plate having an aperture that has a width G, or may be than two panels that define a plurality of gaps. Depending on a number of factors including, but not limited to, the horizontal spacing (G) between the panels 500a and 500b, the vertical spacing (Z) of the panels 500a and 500b above the plane 151, the dielectric constant of the panels 500a and 500b, or other process parameters of the plasma 502, the range of incident angles (θ) may be vary over a range of angles, such as between +60° and −60° centered about 0°. In some embodiments of separate panels 500a, 500b, the panels may be arranged at different Z-spacings above substrate 520, and the ions 508 may define an asymmetrical shape with respect to 0°. This may provide a further degree of control of selective deposition. For example, the asymmetric shape may be dictated by the pattern that is being deposited on the substrate. Moreover, the asymmetric shape of the ions can also be used to change/improve deposition uniformity for certain types of patterns.

Ions 508 may be attracted from the plasma 502 across the plasma sheath 504 by different mechanisms. In one instance, the substrate 520 is biased to attract ions 508 from the plasma 502. The ions 508 may include molecular species such as silicon-containing species, carbon-containing species, metal-containing species, or other species, and may be configured to deposit on substrate 520. The ions 508 also may be a noble gas, a p-type dopant-containing species, an n-type dopant-containing species, hydrogen, nitrogen, oxygen, or other species known to those skilled in the art.

Moreover, as depicted in FIG. 5, the ions 508 exiting plasma 502 may be focused due to the convex curvature of the boundary 506 of the plasma sheath with respect to plane 516. Thus, for example, ion trajectories 510, 512, and 514 may draw closer or cross one another in a region below focusing plate system 500. Depending on factors such as the vertical separation Z, the width D of the impact area of the substrate that receives the ions 508 may be controlled, and may be smaller than the gap G, as depicted.

In various embodiments the gap G may have values ranging from about one tenth millimeter to several centimeters. Accordingly, by focusing the ions 508, focusing plate system 500 may direct ion beams that produce an impact area whose width D is as small as ten micrometers, or may be as large as about one centimeter or more.

Figure 6:
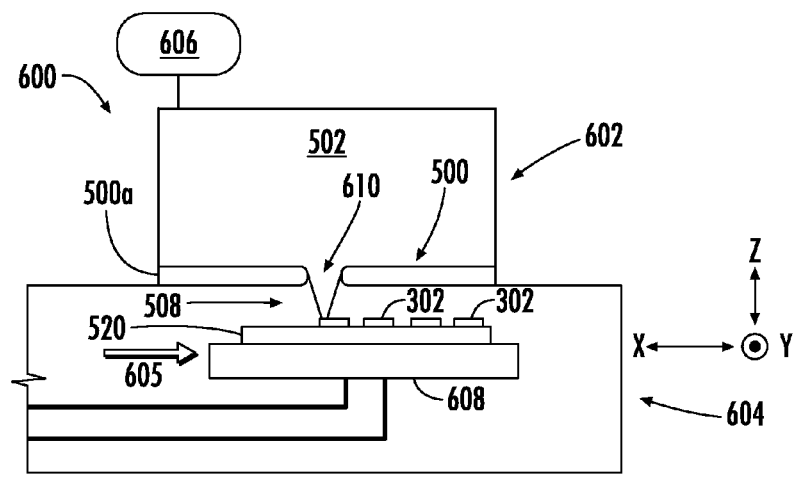
FIG. 6 depicts a system for ion-assisted selective deposition according to an embodiment of the disclosure.

FIG. 6 is a block diagram of a plasma processing system 600 consistent with an embodiment of the disclosure that employs the focusing plate system 500. In various embodiments plasma processing system 600 is employed to perform ion-assisted selective deposition of material on a substrate. The plasma processing system 600 includes a plasma chamber 602, focusing plate system 500 and a process chamber 604. A gas source 606 is connected to the plasma chamber 602. In some embodiments, a plasma source (not separately shown) used for generating the plasma 502 may be, for example, an RF plasma source, inductively-coupled plasma (ICP) source, indirectly heated cathode (IHC), or other plasma sources known to those skilled in the art. The focusing plate system 500 may be cooled. The creation of the plasma 502 from the plasma source may be continuous (DC) or pulsed. The plasma 502 may be biased and a bias power supply (not shown) may be provided to provide a continuous or pulsed bias on a substrate holder 608 to attract the ions 508 to the substrate 520.

The focusing plate system 500 may have at least one aperture 610 through which ions 508 are directed to a substrate. In the embodiment shown, the substrate 520 may be a heterojunction IBC solar cell substrate, but may be other type of substrates in other embodiments. In various embodiments, the substrate holder 608 may move with respect to focusing plate system 500 along any of the X, Y, or Z directions as defined by the Cartesian system illustrated in FIG. 6. In some embodiments, the substrate holder 608 may be scanned along a direction 605 parallel to the plane 516 while the substrate 520 is exposed to ions 508.

One or more substrates 520, which may be solar cells, may be arranged on substrate holder 608. The distance between the focusing plate system 500 and the substrate 520 may be controlled to compensate for any thermal expansion of the focusing plate system. In some embodiments, multiple substrates 520 may be arranged in an array or matrix that is N substrates 100 wide and N substrates 100 long (where the "N" variable in the width dimension can be different from that in the length dimension). In FIG. 6, the substrate holder 608 is configured to support a substrate 520 with its exposed surface facing up in a horizontal plane. However, in other embodiments, the substrate may be held upside down, in a vertical position, or at an angle, which may be facilitated using electrostatic clamping, mechanical clamping, or a combination of electrostatic and mechanical clamping to retain the substrate 520.

In some embodiments, ion-assisted selective deposition using plasma processing system 600 may be performed in the following manner. When substrate 520 is placed proximate the focusing plate system 500, the substrate 520 is exposed to ions 508, which may strike the substrate over an area that is in part determined by a width G and length of an aperture 610 (in the Y-direction). The area exposed to ions may simultaneously be exposed to a flux of gaseous species (not shown) that impinge on the surface of the substrate, as described below with respect to FIG. 7. The ions 508 may facilitate reaction of the gaseous species with the substrate surface so that the impinging species bond with those portions of the substrate exposed to the ions. In other portions of the substrate 520 that are not exposed to ions 508, the impinging gaseous species may fail to react and bond with substrate 520. Thus, by controlling the portions of the substrate to be exposed to ions, material to be deposited may be selectively placed where desired on the substrate 520.

To aid in selective deposition over desire portions of the substrate, the substrate 520 may be scanned with respect to focusing plate system 500, so that multiple regions may be exposed to ions 508 by moving different portions of substrate 520 to be adjacent to aperture 610. As depicted in FIG. 6, this may result in formation of multiple deposited portions on the substrate. In the example of FIG. 6, the portions may be p-type a-Si portions 302.

Referring also to FIG. 5, in some instances, the width D of the impact area of ions on substrate 520 may be narrower than the width of a desired feature to be patterned. In this case, the substrate 520 may be scanned with respect to the focus plate aperture 610 for a distance that provides ions 508 over the desired width. The plasma 502 may then be extinguished until the focus plate aperture 610 is disposed opposite another portion of the substrate 520 to be exposed to ions. In this manner, multiple p-type a-Si portions 302 are formed, as depicted in FIG. 6. Alternatively, the plasma 502 need not be extinguished between p-type a-Si portions 302. Instead, a bias between plasma 502 and substrate 520 may be minimized such that any ions that reach substrate 520 have minimal energy that is insufficient to induce selective deposition of species to be introduced in a subsequent step. Because the ions may be focused to a width as small as 10 micrometers in some embodiments, ion bombarded regions as narrow as ten or a few tens of micrometers may be formed using plasma processing system 600. In this manner, ion energy provides an enhanced ability to focus the ions to selectively deposit material.

Turning now to FIG. 7, an embodiment of ion-assisted selective deposition is illustrated in more detail for a substrate 520. In this embodiment, substrate 520 may be a heterojunction IBC solar cell structure that includes an intrinsic a-Si layer 352 and ARC layer 354 on the frontside. In a step illustrated in FIG. 7a, the back side of the substrate 520 is exposed to ions 702 that are directed through a focusing plate system 500. In addition to ions 702, gaseous species 704 are provided in the ambient of substrate 520 as illustrated. The gaseous species 704 may impinge upon substrate 520 in various regions besides the region impacted by ions 702, as shown in FIG. 7a. In some embodiments, the ions 702 and gaseous species 704 may result from species that are introduced to form plasma 502. In one example for selective deposition of a-Si, gas compositions that may be used to produce plasma 502 include mixtures of silane, disilane, and/or inert gas materials. However, a wide variety of known gas compositions are possible. At least portions of these species may be ionized to forms ions 702. In the plasma 502, some species may also be decomposed or combined with other species to form product species, which may or may not be ionized and may impinge upon substrate 520 as gaseous species 704 and/or ions 702.

The gaseous species 704 may at least in part be species that are designed to deposit on substrate 520 given proper conditions. In the case of deposition of amorphous silicon, the gaseous species 704 may include silicon-containing species, as well as dopant containing species, such as boron- or phosphorous-containing species. In various embodiments, at least a portion of the gaseous species 704 may, but need not be, composed of ions 702. Thus, the ions 702 may be derived from gaseous silicon-containing species, such as silane or disilane. In addition, ions 702 may include inert gas species that facilitate the selective deposition on substrate 520 of other species, such as silane. Such species include He, Ar, Xe, and Ne.

In various embodiments, a bias voltage between substrate 520 and plasma 502 may be set at a level below a few thousand volts, for example below about 1000 V. In this manner, the sputtering of surface material or other damage in regions of the substrate 520 exposed to ions 702 may be maintained at an acceptable level.

Figure 7A:
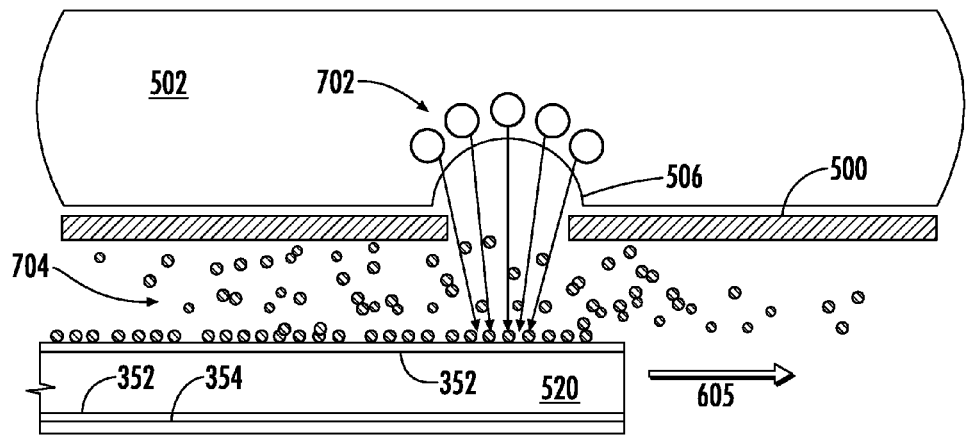
FIGS. 7a-7f depict various stages of patterning a substrate by selective deposition using a focusing plate consistent with an embodiment of the disclosure.
Figure 7B:
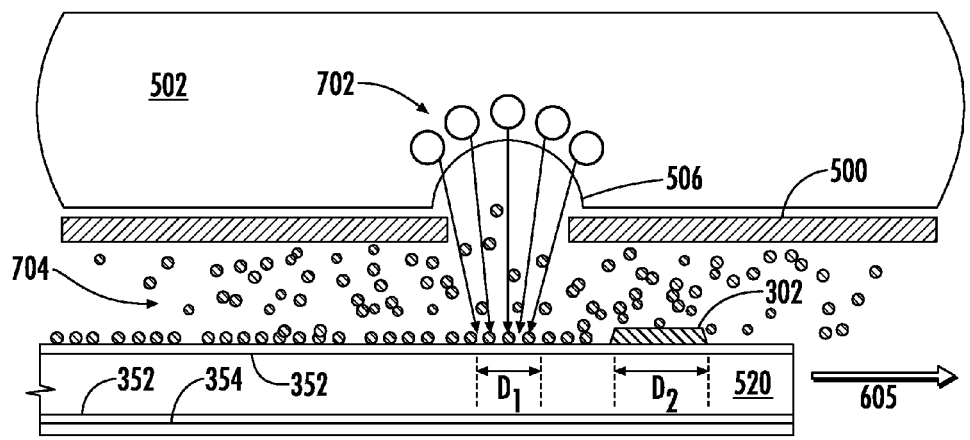

As depicted in FIG. 7b, ions 702 may be focused to a width $D_1$ on substrate 520. The substrate 520 may be exposed to ions 702 for a duration that is designed to deposit a p-type a-Si portion 302 to a desired thickness, such as 40 nm. As illustrated in FIG. 7b, after deposition in a first region of a first p-type a-Si portion 302, the substrate 520 may then be scanned to a second region for deposition of a second p-type a-Si portion 302. In some embodiments, the width $D_2$ of the p-type a-Si portions 302 may be wider than the width $D_1$, as shown in FIG. 7b. This may be accomplished by scanning the focusing plate along the direction 605 while the substrate is exposed to ions 702 to form a continuous p-type a-Si portion 302 that is wider than the width $D_1$ of the ions 702 at the substrate surface.

Figure 7C:
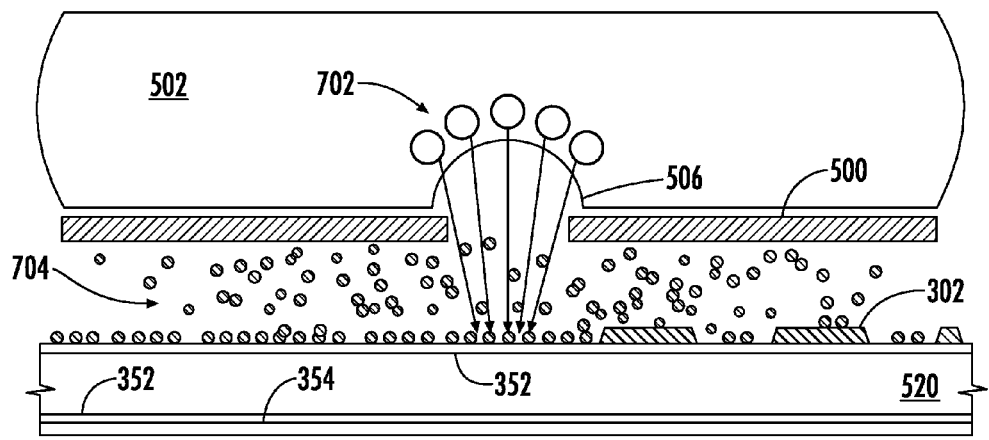

As illustrated in FIG. 7c, the process may continue until multiple p-type a-Si portions 302 are formed on substrate 520. In some embodiments, the width $D_2$ of the multiple p-type a-Si portions 302 may be uniform. However, the width may also be varied between p-type a-Si portions 302 by varying the length of scanning of substrate 520, if any, during exposure to ions 702 and/or by varying the beam width, among other factors.

Figure 7D:
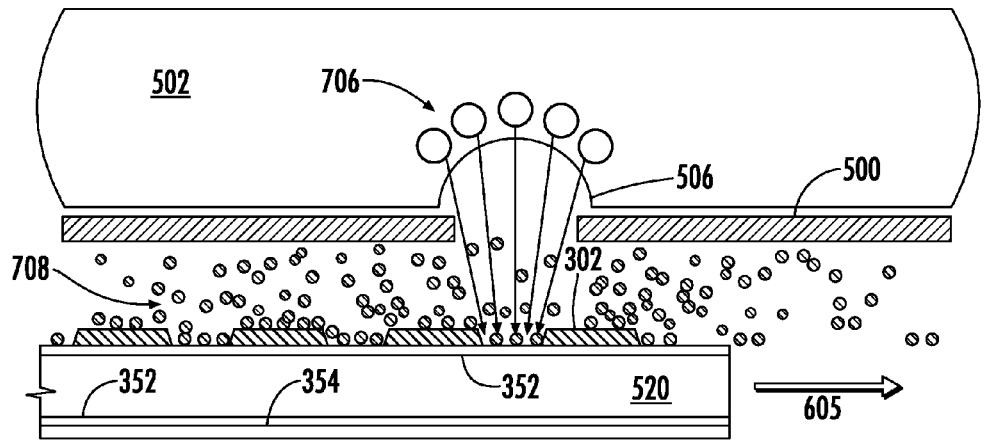
Figure 7E:
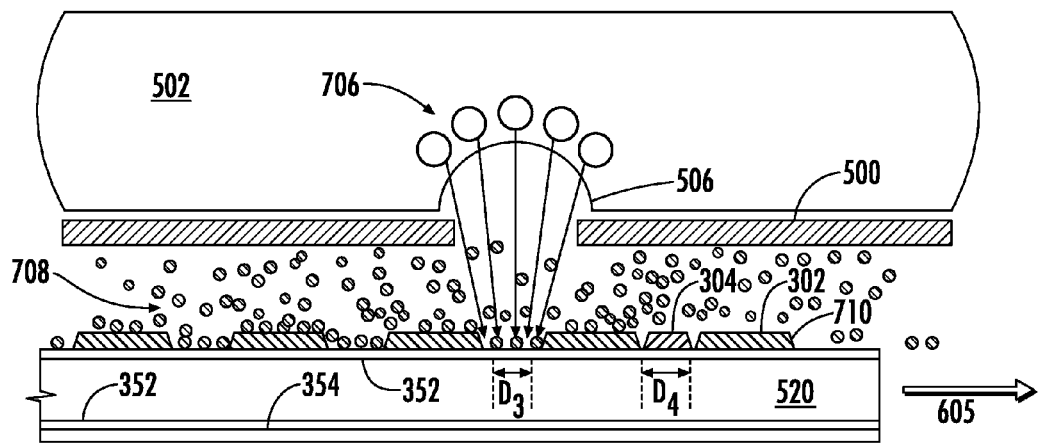
Figure 7F:
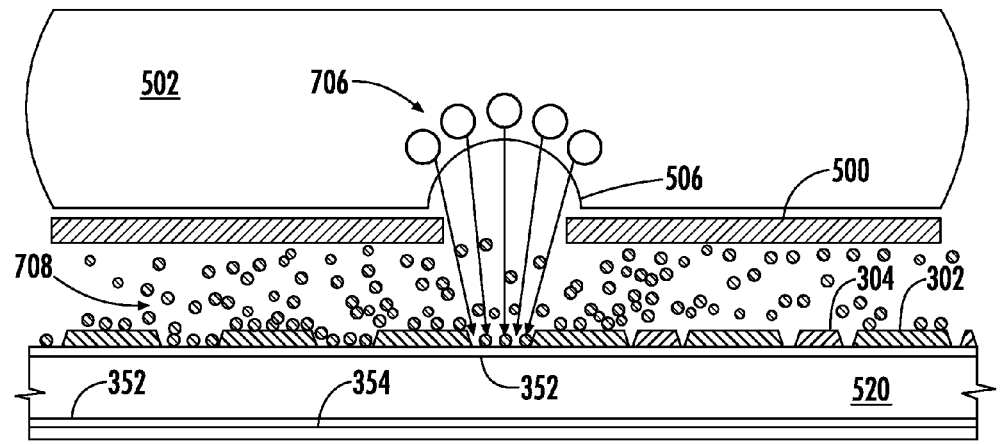

Turning to FIGS. 7d-f, a process is illustrate for forming a second type of deposit, namely, portions 304, which may be an n-type a-Si deposit in some embodiments. At the step illustrated in FIG. 7d, the substrate 520 may be exposed to ions 706. The substrate may be positioned such that ions 706 are directed to a region of the substrate that lies between adjacent p-type a-Si portions 302. As illustrated, the beam formed by ions 706 may be designed to intercept substrate 520 between the adjacent p-type a-Si portions 302. The substrate 520 is also exposed to gaseous species 708, which may be the same as ions 706, different from ions 706, or may form a part of ions 706. In embodiments of selective deposition of silicon, gaseous species 708 may be silicon-containing species and/or dopant containing species as discussed above with respect to gaseous species 704. In one embodiment for forming a heterojunction IBC, gaseous species 704 may include boron, while gaseous species 708 may contain phosphorous. Thus, exposure to ions 706 and gaseous species 708 may result in formation of n-doped silicon portions 304 (see FIG. 7e) on substrate 520.

As depicted at FIG. 7e, the substrate may be scanned so that other portions of substrate 520 are exposed to ions 706. In some embodiments, the width $D_3$ of ions 706 may be designed so that ions 706 do not impinge on adjacent p-type a-Si portions 302. In this manner n-type a-Si portions 304 may be formed in those regions of the substrate between the p-type a-Si portions 302. The width $D_3$ of ions 706 may be different from width $D_1$ of ions 702 so that the width $D_4$ of n-type a-Si portions (which may be greater than $D_3$) may be different than that of p-type a-Si portions ($D_2$) as desired. The width $D_4$ of n-type a-Si portions 304 may be controlled by a combination of controlling beam focus of ions 702, separation Z (see FIG. 5) and scanning of substrate 520, among other factors. The process of FIGS. 7d,e may be repeated (see FIG. 7f) until as many n-type a-Si portions 304 as desired are formed.

It is to be noted that ions 702 and 706 may be formed using relatively focused beams in which widths $W_1$ and $W_3$ may be on the order of 10-100 micrometers, while the aperture width G of a focusing plate system 500 may be on the order of 1-10 mm. Accordingly, a higher concentration (per unit area) of ions than that at the level of focusing plate system 500 may be applied during growth of a-Si portions 302, 304. In some cases, a-Si portions as thick as 1 micrometer have been grown. However, it will be appreciated that in order to achieve a relatively higher throughput of substrates, it may be desirable to grow a-Si portions 302, 304 only to a thickness needed for the desired application.

It is further to be noted that although a-Si portions 302 (304) may appear isolated from other a-Si portions 302 (304), the individual portions may be joined in other regions of the substrate to form a single contact structure by appropriate design of an aperture and/or by appropriate scanning. Thus, a known finger-like interdigitated structure may be formed as generally depicted in FIG. 7, in which the a-Si portions 302, 304 represent cross-sections of individual fingers of each respective contact (not including the metal layer to be deposited above each semiconductor portion).

In other embodiments, for example, processes for forming homojunction IBC solar cells, rather than depositing (doped) silicon material, the steps generally depicted in FIG. 7 may be used to selectively deposit p-type and n-type dopant material itself, and the regions designated as 302 and 304 may correspond to boron and phosphorous, respectively, instead of respective p-type a-Si and n-type a-Si.

In various embodiments, the abruptness of the edges of the selectively deposited portions can be controlled by the angular distribution of the incident ions. Thus, a more narrow angular distribution may produce a more steep faceted edge (see element 710, FIG. 7e), while a more broad angular distribution may produce a less steep faceted edge.

In order to control properties of materials deposited by ion-assisted selective deposition, the substrate temperature may be actively controlled. For example, in some embodiments of selective deposition of a-Si based materials, the substrate temperature may be set at levels up to about 400-500° C. to improve properties such as film purity and density.

Although the above examples detail methods for forming patterned doping of silicon based materials in a substrate, the present embodiments extend to many other systems. In some embodiments, methane-containing plasmas, or similar carbon-containing plasmas, may be used to produce ions and/or gaseous species for ion-assisted selective deposition of carbon containing materials. Plasmas containing combinations of methane and silane or other similar known molecules may be used for selective deposition of silicon carbide type materials including doped silicon carbide.

In further embodiments, conductive polymers may be selectively deposited using ion-assisted selective deposition. In still further embodiments, ion-assisted selective deposition of nickel silicide may be performed using nickel phosphate or similar materials.

In addition to depositing semiconductors or conductive materials, in other embodiments a patterned insulator material may be deposited. Examples, of insulator material that may be selectively deposited include silicon nitride, silicon oxide, titanium dioxide, and other materials. Insulators materials may be deposited by providing known gaseous species that include the elements to be incorporated in the insulating deposits, such as nitrogen, ammonia, silane, or similar molecules in the case of silicon nitride. Such selective deposition of insulators may be used to place insulators, such as anti-reflective coatings, in a desired pattern on a frontside of a solar cell.

It is to be further noted that the shape of selectively deposited portions such as a-Si portions 302, 304 may be any desired shape. This may be accomplished by proper design of shapes of apertures in a focusing plate system 500 as well as scanning of a substrate with respect to the focusing plate. For example, referring also to FIG. 6, respective deposited p-type and n-type a-Si portions 302, 304 may form interdigitated finger-like structures if aperture 610 has a slot-like shape in the X-Y plane. However, a focusing plate may have apertures having circular shapes, hexagonal shapes, or complex shapes, in order to produce deposit similar shapes on a substrate. Moreover, in addition to scanning along the direction X, in some embodiments a substrate may be scanned along the direction Y (into the figure), which affords the ability to create more complex patterns of ion-assisted selective deposition.

There has thus been provided a high throughput method and system for manufacturing substrates that require a pattern of different doped regions. Such substrates include high efficiency solar cells, including heterojunction and homojunction IBC cells. The ability to deposit patterned structures without a mask facilitates the elimination of expensive and time consuming lithography steps. Furthermore, in-situ deposition and etch of such patterned structures is provided in various embodiments. By providing focused ions, small patterned regions whose width may be approximately as narrow as the beam of focused ions may be formed on a substrate.

The methods described herein, may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings.

Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of patterning a substrate, comprising:
   providing a focusing plate adjacent to a plasma chamber containing a plasma, the focusing plate configured to extract ions from the plasma through at least one aperture that provides focused ions towards the substrate; and
   directing first ions through the at least one aperture to one or more first regions of the substrate, the first ions configured to react with first gaseous species provided in ambient of the substrate on the one or more first regions of the substrate, wherein the first gaseous species comprise a dopant of a first type; and
   directing second ions through the at least one aperture to one or more second regions of the substrate, the second ions configured to react with second gaseous species provided in ambient of the substrate on the one or more second regions of the substrate, the second gaseous species comprising a dopant of a second type.

2. The method of claim 1, wherein the first ions comprise at least a portion of the first gaseous species.

3. The method of claim 1, wherein the focusing plate comprises a plasma sheath modifier that is operable to modify a shape of a boundary between the plasma and a plasma sheath so as to direct the ions into a focused beam.

4. The method of claim 1, wherein the step of directing the first and second ions comprises providing a bias between a substrate holder and the plasma to attract the first and second ions toward the substrate, the substrate being disposed on the substrate holder.

5. The method of claim 1 further comprising scanning the substrate with respect to the focusing plate so as to produce a plurality of first regions.

6. The method of claim 1, wherein the first gaseous species provided in ambient of the substrate selectively grows on the one or more first regions faster than on regions of the substrate not exposed to the first ions.

7. The method of claim 1, wherein the substrate comprises a heterojunction back contact solar cell, the first gaseous species configured to react to form one from a group consisting of an intrinsic amorphous silicon on the one or more first regions and a p-type amorphous silicon on the one or more first regions, and wherein the second gaseous species reacts to form n-type amorphous silicon on the one or more second regions.

8. The method of claim 1, wherein the substrate comprises a homojunction back contact solar cell, the method comprising:
   reacting and directing the first ions to condense p-type dopant material without silicon; and
   directing the second ions to react n-type dopant material without silicon.

9. The method of claim 8, further comprising annealing the substrate to form respective p-type and n-type regions.

10. The method of claim 1, further comprising performing a blanket etch after reacting the respective dopants of the first and second type.

11. The method of claim 1, wherein the first gaseous species comprise species configured to form an insulator material after reacting on the substrate.

12. The method of claim 1, comprising maintaining ion energy of the first ions below about 1000 eV.

13. The method of claim 1, comprising:
   providing the first ions with a first ion beam width at a surface of the substrate; and
   providing the second ions with a second ion beam width different from the first width at the surface of the substrate.

14. The method of claim 1, wherein the first species form one or more first portions having a first width, and the second species form one or more second portions having a second width.

15. A method of patterning a solar cell substrate, comprising:
   providing a focusing plate adjacent to a plasma chamber containing a plasma, the focusing plate configured to extract ions from the plasma through at least one aperture that provides focused ions towards the solar cell substrate;
   directing first ions through the at least one aperture to one or more first regions of the solar cell substrate, the first ions arranged to react with first gaseous species comprising semiconductor material of a first dopant type on the one or more first regions; and
   directing second ions through the at least one aperture to one or more second regions of the solar cell substrate different from the one or more first regions, the second ions arranged to react with second gaseous species comprising semiconductor material of a second dopant type on the one or more second regions.

16. The method of claim 15, comprising:
   providing the first gaseous species only during the directing of the first ions; and
   providing the second gaseous species only during the directing of the second ions.

17. The method of claim 16, wherein during the step of providing the first ions, the plasma comprises a mixture of species including dopant species of a first type, and during the step of providing the second ions, the plasma comprises a mixture of species including dopant species of a second type.

* * * * *